(12) United States Patent
Shieh et al.

(10) Patent No.: US 7,029,992 B2
(45) Date of Patent: Apr. 18, 2006

(54) LOW OXYGEN CONTENT PHOTORESIST STRIPPING PROCESS FOR LOW DIELECTRIC CONSTANT MATERIALS

(75) Inventors: Jyu-Horng Shieh, Hsin-Chu (TW); Yi-Nien Su, Kaohsiung (TW); Jang-Shiang Tsai, Xindian (TW); Chen-Nan Yeh, Taipei County (TW); Hun-Jan Tao, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/920,099

(22) Filed: Aug. 17, 2004

(65) Prior Publication Data

US 2006/0040474 A1 Feb. 23, 2006

(51) Int. Cl.
*H01L 21/322* (2006.01)

(52) U.S. Cl. ........................ 438/474; 438/475; 438/513
(58) Field of Classification Search ............... 438/725, 438/963, 706, 710, 712, 513, 514, 515, 423, 438/197, 602, 603, 604, 536, 905, 935, 474, 438/475, 770, 775
See application file for complete search history.

(56) References Cited

U.S. PATENT DOCUMENTS

| | | | |
|---|---|---|---|
| 6,030,901 A * | 2/2000 | Hopper et al. | 438/711 |
| 6,235,453 B1 * | 5/2001 | You et al. | 430/329 |
| 6,319,567 B1 * | 11/2001 | Senzaki et al. | 427/565 |
| 6,346,490 B1 | 2/2002 | Catabay et al. | |
| 6,426,304 B1 * | 7/2002 | Chien et al. | 438/727 |
| 6,465,372 B1 | 10/2002 | Xia et al. | |
| 6,528,432 B1 | 3/2003 | Ngo et al. | |
| 6,638,875 B1 | 10/2003 | Han et al. | |
| 6,709,715 B1 * | 3/2004 | Lang et al. | 427/489 |
| 6,787,861 B1 * | 9/2004 | Lucovsky et al. | 257/410 |
| 2005/0106893 A1 * | 5/2005 | Wilk | 438/758 |

* cited by examiner

*Primary Examiner*—David Nhu
(74) *Attorney, Agent, or Firm*—Duane Morris LLP

(57) ABSTRACT

A plasma containing 5–10% oxygen and 90–95% of an inert gas strips photoresist from over a low-k dielectric material formed on or in a semiconductor device. The inert gas may be nitrogen, hydrogen, or a combination thereof, or it may include at least one of nitrogen, hydrogen, $NH_3$, Ar, He, and $CF_4$. The operating pressure of the plasma may range from 1 millitorr to 150 millitor. The plasma removes photoresist, the hard skin formed on photoresist during aggressive etch processes, and polymeric depositions formed during etch processes. The plasma strips photoresist at a rate sufficiently high for production use and does not appreciably attack carbon-containing low-k dielectric materials. An apparatus including a plasma tool containing a semiconductor substrate and the low oxygen-content plasma, is also provided.

17 Claims, 1 Drawing Sheet

LOW OXYGEN CONTENT PHOTORESIST STRIPPING PROCESS FOR LOW DIELECTRIC CONSTANT MATERIALS

FIELD OF THE INVENTION

The invention relates most generally to a semiconductor device that includes low dielectric constant materials, and a method for manufacturing the semiconductor device. More particularly, the invention relates to a method for stripping a photoresist material formed over the low dielectric constant material.

BACKGROUND

The escalating requirements for high-density and performance associated with ultra large scale integration (ULSI) semiconductor devices require responsive changes in interconnection technology. Low dielectric constant ("low-k") interlevel dielectric (ILD) materials have been found effective in mitigating RC (resistance capacitance) propagation delays to reduce power consumption and crosstalk. Materials which show promise as low-k dielectric materials include various carbon-containing materials. Such carbon-containing low-k dielectric materials include various polymers with carbon occupying a position in the backbone of the polymer. Typical of such carbon-containing polymers are benzocyclobutene (BCB), methyl silsesquioxane (MSQ), Flare-R®, Silk®, Orion, JSR and Black Diamond®. Although materials having a dielectric constant of less than about 3.9 are considered low-k dielectric materials, as integrated circuit devices and interconnect technologies continue to scale smaller, low-k dielectric materials with even lower dielectric constants have become useful, and it is increasingly popular to use materials having dielectric constants less than or equal to 3, i.e., $k \leq 3$. The challenges posed by the increasingly fragile and higher carbon content of the $k \leq 3$ materials impact plasma technology used in the manufacture of semiconductor devices because the $Si-CH_3$, $Si-C$ and other carbon bonds in the low-k dielectric material are susceptible to attack by the plasma processing. More particularly, the oxygen plasmas typically used to strip the organic photoresist layers formed over the low-k dielectric materials, may penetrate the low-k dielectric material and complex with the carbon in the low-k dielectric material. Plasma excitation during the stripping process results in atomic oxygen that combines with carbon from the low-k dielectric material and causes the carbon to leach out of the film, undesirably increasing the dielectric constant of the film.

As such, there have been attempts to strip photoresist using oxygen-free plasmas. One attempt to strip photoresist in an oxygen-deficient environment is provided in U.S. Pat. No. 6,030,901 issued on Feb. 29, 2000 to Hopper, et al, entitled Photoresist Stripping Without Degrading Low Dielectric Constant Materials. U.S. Pat. No. 6,235,453, issued May 22, 2001 to You, et al, entitled Low-k Photoresist Removal Process, teaches a photoresist removal process that uses a trace amount of $O_2$. Such attempts have generally been unsuccessful because of low stripping rates and polymer build-up in the plasma chamber. The oxygen in conventional plasmas typically complexes with the organic photoresist to produce gases such as $CO_2$, $CO$, and $H_2O$, which are easily pumped out of the plasma chamber. Due to the lack or only trace amount of oxygen, each of the aforementioned references include the shortcomings of a low strip rate due to the lessened reactivity toward the photoresist, and polymer build-up in the etch chamber due to the lack of liberation of easily removable gases such as $CO$, $CO_2$ or $H_2O$. Furthermore, such oxygen-deficient plasmas lack the ability to strip polymeric by-products or penetrate the hard skin which forms on photoresist layers during aggressive etch processes such as the via etch in a via first process sequence or other damascene technology etches.

It would therefore be desirable to provide a method for manufacturing a semiconductor device that overcomes the above-described shortcomings and provides a photoresist stripping process that does not degrade low-k dielectric material.

SUMMARY OF THE INVENTION

To address these and other needs and in view of its purposes, an aspect of the invention provides a method for removing photoresist from a semiconductor substrate. The method includes providing a semiconductor device with a low-k dielectric layer formed thereon and photoresist formed over the low-k dielectric layer; and removing the photoresist from over the low-k dielectric layer using a plasma having a pressure no greater than 100 mT and containing 5–10 volume % oxygen and 90–95 volume % of an inert gas.

Another aspect of the invention provides a method for removing photoresist from a semiconductor substrate. A semiconductor device is provided with a photoresist layer formed over a carbon-containing dielectric layer formed on the semiconductor device. The photoresist is removed from over the carbon-containing dielectric layer using a plasma having a pressure within the range of 1–150 mTorr and containing 5–10 volume % oxygen and 90–95 volume % of an inert gas. The inert gas is comprised of at least one of nitrogen, hydrogen and $NH_3$.

In another aspect, provided is a composition for stripping photoresist from a carbon-containing dielectric formed on a semiconductor device and having a dielectric constant no greater than 3. The composition comprises a plasma with 5–10 volume % $O_2$ and 90–95 volume % of an inert gas composed of $H_2$ and $N_2$, and a pressure no greater than 100 millitorr.

In another aspect, provided is an apparatus for stripping photoresist from a semiconductor device. A plasma tool contains a semiconductor device formed on a substrate having photoresist formed over a low-k dielectric layer, and a plasma maintained at a pressure within the range of 1–150 mTorr. The plasma includes 5–10 volume % oxygen and 90–95 volume % of an inert gas including at least one of hydrogen, nitrogen and $NH_3$. The plasma tool may be a downstream stripper, a reactive ion etcher, an inductively coupled plasma tool, an magnetically enhanced reactive ion etcher, or a microwave plasma tool.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and the following cross-sectional drawing, in which.

DETAILED DESCRIPTION

Figure 1:
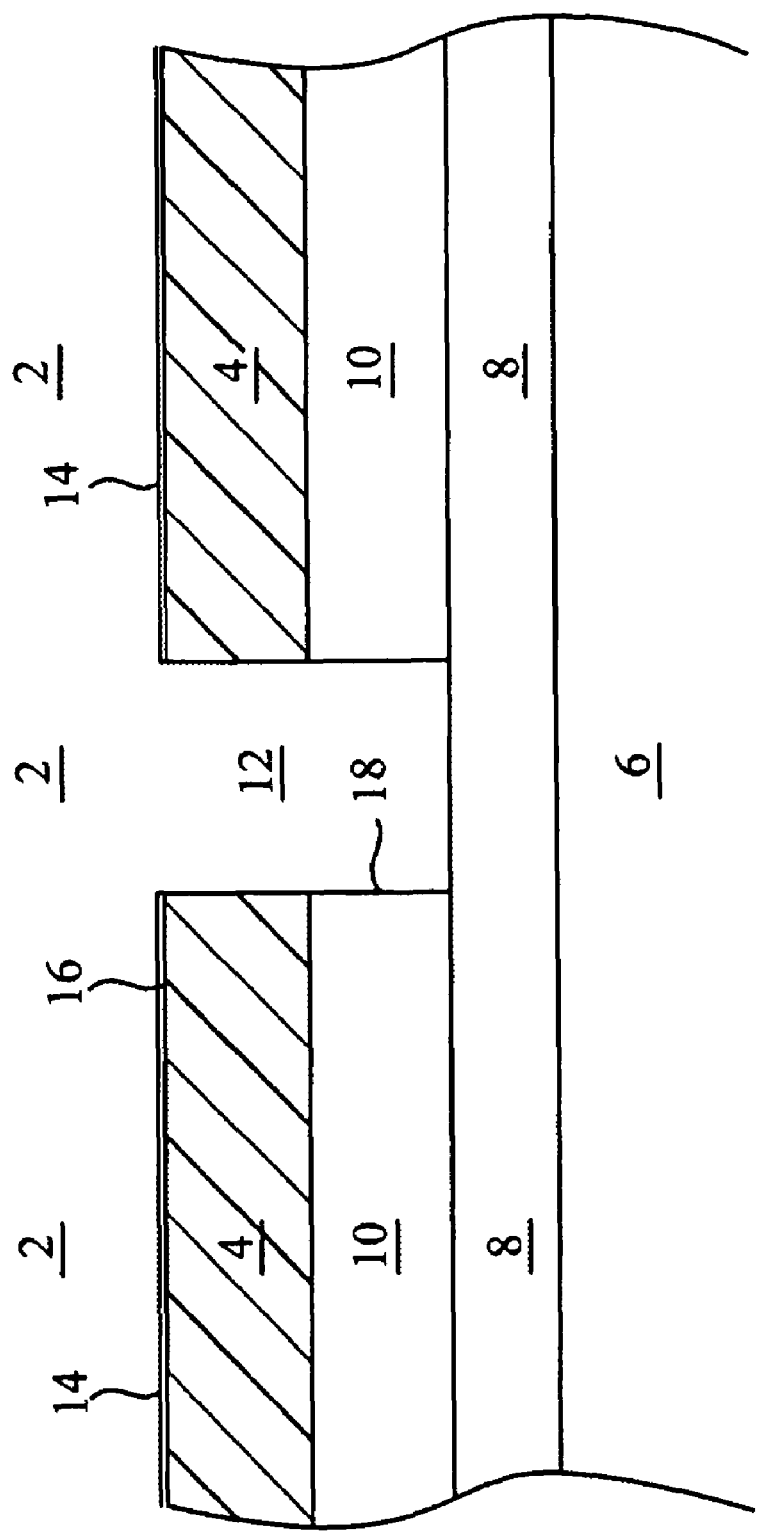
FIG. 1 shows a photoresist film formed over a low-k dielectric material and illustrates an exemplary photoresist stripping process of the invention.

In one aspect, the invention provides a plasma operation that provides a sufficiently high photoresist stripping rate due to the presence of oxygen, yet does not appreciably degrade a low-k dielectric material. Another aspect of the invention provides a plasma composition suitable for stripping photoresist without degrading a low-k dielectric material and another aspect of the invention provides an apparatus comprising a plasma tool with a chamber containing a substrate having photoresist thereon and a plasma suitable for stripping the photoresist without degrading a low-k dielectric material.

A low-k dielectric film may be formed on any of various semiconductor substrates and in or on any of various semiconductor devices formed using various technologies. A photoresist film is formed over the low-k dielectric film and patterned. An etching process is then carried out using the patterned photoresist as a mask and forming at least an opening in the low-k dielectric material.

An exemplary structure is shown in FIG. 1 which illustrates plasma 2 used to strip a photoresist film 4 formed over semiconductor substrate 6. Low-k dielectric layer 10 is formed over semiconductor substrate 6 and may form part of various semiconductor devices. In the illustrated embodiment, low-k dielectric layer 10 is formed over layer 8 which may represent a film or various films of various compositions. Conventional methods may be used to form low-k dielectric layer 10 and the low-k dielectric material advantageously has a dielectric constant no greater than 3.9, the dielectric constant of silicon dioxide. In one exemplary embodiment, low-k dielectric layer 10 may have a dielectric constant no greater than 3.0, but other dielectric constants may be used in other exemplary embodiments. Low-k dielectric layer 10 may be a carbon-containing film and may include bonds such as $S_1$—$CH_3$ and Si—C bonds. Additional or other carbon bonds may be included depending on the composition and nature of the low-k dielectric film. Low-k dielectric layer 10 may include various thicknesses and some suitable materials that may be used as low-k materials are benzocyclobutene (BCB), methyl silsesquioxane (MSQ), Flare-R®, Silk®, JSR, Orion, and Black Diamond®, carbon-doped $SiO_2$, and similarly available commercial materials. Low-k dielectric layer 10 may be an interlevel dielectric used in various applications and may be a composite of multiple low-k films formed of the aforementioned materials. Opening 12 is formed in low-k dielectric layer 10 and may represent various openings such as vias, contact openings, and trenches for damascene interconnect lines. In another exemplary embodiment, not illustrated in FIG. 1, a dual damascene opening may be used. In one exemplary embodiment, the opening may be a via opening or trench opening formed using a via first dual damascene processing sequence.

Photoresist film 4 may be a conventional, commercially available positive or negative photoresist and may be coated onto low-k dielectric layer 10 using conventional methods. Conventional patterning processes may be used to pattern photoresist film 4 and conventional etching techniques may be used to form opening 12 in low-k dielectric layer 10. In one exemplary embodiment, an ARC, anti-reflective coating, (not shown) may be formed between low-k dielectric layer 10 and photoresist film 4. Depending on the etching chemistry and other etching parameters used, a hard skin 14 may form on top surface 16 of photoresist film 4. Hard skin 14 is a polymeric combination of photoresist material and etch by-products, and typically forms during the via etch process in the via first technology process sequence due to the extended etch times and etching characteristics employed. Hard skin 14 may also be formed in other aggressive etch processes or when successive etching processes are used, such as in a via-first processing technology sequence. Hard skin 14 is particularly difficult to remove using conventional photoresist stripping methods and is practically unremovable using plasma operations that are oxygen-deficient or contain only trace amounts of oxygen. The plasma stripping process of the invention, however, effectively removes the hard skin.

Furthermore, various aggressive etching processes, such as the via etch in a via-first processing sequence, can also create a polymer coating on the exposed wall surfaces of the etched opening such as on sidewalls 18. This may be due to backsputtering or other etch effects. The polymeric coating may include materials such as Si, F, O, H and N, but the polymeric coating may include additional and other materials in other exemplary embodiments. Such polymeric coatings are difficult to remove and are also virtually unremovable using photoresist strip processes that are deficient of oxygen or contain only trace amounts of oxygen. In contrast, the photoresist strip process of the present invention effectively removes such polymeric coatings and produces a clean via or other opening.

Plasma 2 is formed in any of various plasma tools that are capable of generating a plasma and controlling plasma parameters such as pressure, temperature, gas flow, plasma power, and which can bias substrate 6. Examples of such plasma tools include reactive ion etchers, microwave plasma etchers, ICP (inductively coupled plasma) etching tools, downstream strippers, and magnetically enhanced reactive ion etchers. Such plasma processing tools are commercially available and tools produced by various manufacturers may be used. Plasma 2 is generated and disposed within an etching or stripping chamber of such a plasma tool along with the semiconductor substrate.

The gas mixture of plasma 2 may include an oxygen, $O_2$, portion and an inert gas portion. In one exemplary embodiment, plasma 2 may consist solely of an oxygen portion and an inert gas portion. The oxygen portion may range from 5–10 volume % and the inert gas may constitute 90–95 volume %. In an exemplary embodiment, the inert gas may include at least one of nitrogen, $N_2$, and hydrogen, $H_2$. In another exemplary reeimbodiment, the inert gas may be $NH_3$. In a further exemplary reembodiment, the inert gas may be nitrogen, hydrogen and at least one of the following: He, Ar, $CF_4$, and $NH_3$. In yet another exemplary embodiment, the inert gas may be a gas mixture containing at least two of the following: nitrogen, hydrogen, helium, argon, $H_2O$, $CF_4$ and $NH_3$. The operating pressure of plasma 2 may range from 1 millitorr to 150 mTorr in one exemplary embodiment and it may be no greater than 100 mTorr in another exemplary embodiment but other pressures may be used as other exemplary embodiments. The operating temperature may range from –20° C. to 100° C. in one exemplary embodiment, but other temperatures may be used in other exemplary embodiments. In one exemplary embodiment, a gas flow of 10 sccm to 5000 sccm may be used to produce plasma 2, but other flow rates may be used in other exemplary embodiments.

Plasma 2 strips photoresist 4, any hard skin 14 that may be present and any polymeric deposits that may be present on exposed etched surfaces. The oxygen content of the plasma is sufficiently low to avoid appreciably degrading low-k dielectric layer 10. Various process times may be used to strip/remove photoresist 4. In one aspect, the invention provides a plasma operation that provides a sufficiently high photoresist stripping rate due to the presence of oxygen, yet does not appreciably degrade low-k layer 10. Various strip rates may be produced for both the photoresist and the hard skin. In an exemplary embodiment, the strip rate for photoresist may range from 500 to 100,000 Å/min.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be arranged in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for removing photoresist from a semiconductor substrate, said method comprising:
    providing a semiconductor device with a low-k dielectric layer formed thereon and photoresist formed over said low-k dielectric layer; and
    removing said photoresist from over said low-k dielectric layer using a plasma having a pressure no greater than 100 mTorr and containing 5–10 volume % oxygen and 90–95 volume % of an inert gas.

2. The method as in claim 1, wherein said inert gas comprises a mixture of only nitrogen and hydrogen.

3. The method as in claim 1, wherein said inert gas comprises at least one of nitrogen and hydrogen.

4. The method as in claim 3, wherein said inert gas further comprises at least one of helium, argon, $NH_3$ and $CF_4$.

5. The method as in claim 1, wherein said inert gas comprises at least two of nitrogen, hydrogen, helium, argon, $NH_3$ and $CF_4$.

6. The method as in claim 1, further comprising patterning said photoresist layer and etching an opening in said low-k dielectric layer prior to said removing.

7. The method as in claim 6, wherein said etching comprises a via etch in a via-first dual damascene processing sequence.

8. The method as in claim 6, wherein said etching comprises forming a hard skin layer composed of photoresist and etch by-products, on said photoresist layer, and said removing includes removing said hard skin layer.

9. The method as in claim 6, wherein said etching is reactive ion etching that produces polymeric depositions on etched features and said removing removes said polymeric depositions.

10. The method as in claim 1, wherein said low-k dielectric layer comprises a carbon-containing dielectric layer having a dielectric constant no greater than 3, and said removing comprises patterning said photoresist layer and etching at least an opening in said carbon-containing dielectric layer.

11. The method as in claim 1, wherein said plasma is maintained at a temperature within the range of −20° C. to 100° C.

12. The method as in claim 1, wherein said removing includes producing said plasma using a gas flow ranging from 10 to 5000 sccm.

13. The method as in claim 1, wherein said removing comprises generating said plasma in one of a downstream stripper, an inductively coupled plasma reactor, a reactive ion etcher, a microwave ion etcher, and a magnetically enhanced reactive ion etcher.

14. A method for removing photoresist from a semiconductor substrate, said method comprising:
    providing a semiconductor device with a carbon-containing dielectric layer formed thereon and photoresist formed over said carbon-containing dielectric layer; and
    removing said photoresist from over said carbon-containing dielectric layer using a plasma having a pressure within the range of 1–150 mTorr and containing 5–10 volume % oxygen and 90–95 volume % of an inert gas, said inert gas comprised of at least one of nitrogen, hydrogen and $NH_3$.

15. A composition for stripping photoresist from a layer of a carbon-containing dielectric having a dielectric constant no greater than 3, said composition comprising a plasma with 5–10 volume % $O_2$ and 90–95 volume % of an inert gas composed of $H_2$ and $N_2$ and a pressure no greater than 100 millitorr.

16. The composition as in claim 15, wherein said inert gas further comprises at least one of Ar, He, $CF_4$, and $NH_3$.

17. An apparatus for stripping photoresist from a semiconductor device comprising
    a plasma tool containing a semiconductor device formed on a substrate that includes photoresist formed over a low-k dielectric layer, and
    a plasma maintained at a pressure within the range of 1–150 mTorr and including 5–10 volume % oxygen and 90–95 volume % of an inert gas including at least one of hydrogen and nitrogen,
    said plasma tool being one of a downstream stripper, a reactive ion etcher, an inductively coupled plasma tool, a magnetically enhanced reactive ion etcher and a microwave etcher.

* * * * *